US011032496B2

(12) United States Patent
Webster

(10) Patent No.: US 11,032,496 B2
(45) Date of Patent: Jun. 8, 2021

(54) ENHANCED SHUTTER EFFICIENCY TIME-OF-FLIGHT PIXEL

(71) Applicant: OmniVision Technologies, Inc., Santa Clara, CA (US)

(72) Inventor: Eric Webster, Mountain View, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 140 days.

(21) Appl. No.: 16/517,904

(22) Filed: Jul. 22, 2019

(65) Prior Publication Data

US 2021/0029311 A1 Jan. 28, 2021

(51) Int. Cl.

| | |
|---|---|
| *H04N 5/355* | (2011.01) |
| *H01L 27/146* | (2006.01) |
| *H04N 5/378* | (2011.01) |
| *G01S 7/4914* | (2020.01) |
| *H04N 13/254* | (2018.01) |

(52) U.S. Cl.
CPC ......... *H04N 5/3559* (2013.01); *G01S 7/4914* (2013.01); *H01L 27/1463* (2013.01); *H01L 27/1464* (2013.01); *H01L 27/14614* (2013.01); *H01L 27/14623* (2013.01); *H01L 27/14636* (2013.01); *H01L 27/14643* (2013.01); *H04N 5/378* (2013.01); *H04N 13/254* (2018.05)

(58) Field of Classification Search
CPC .... H04N 5/3559; H04N 13/254; H04N 5/378; H01L 27/14614; H01L 27/1464; H01L 27/14643; H01L 27/14623; H01L 27/14636; H01L 27/1463; G01S 7/4914

USPC .......................................................... 257/79
See application file for complete search history.

(56) References Cited

U.S. PATENT DOCUMENTS

| | | | | |
|---|---|---|---|---|
| 2010/0039546 | A1* | 2/2010 | Cohen ............... | H01L 27/14603 348/308 |
| 2011/0199602 | A1* | 8/2011 | Kim ..................... | G01S 7/4863 356/5.01 |
| 2013/0221410 | A1* | 8/2013 | Ahn .................. | H01L 27/14629 257/225 |
| 2014/0291481 | A1* | 10/2014 | Zhang ................. | H01L 27/1463 250/208.1 |
| 2015/0340391 | A1* | 11/2015 | Webster ............ | H01L 27/14621 348/322 |
| 2016/0204142 | A1* | 7/2016 | Um ..................... | H01L 27/1463 257/446 |

(Continued)

*Primary Examiner* — Duy T Nguyen

(57) ABSTRACT

A time-of-flight pixel array comprises multiple pixel cells. The pixel cell comprises a light collection region, a light shielded region, and a deep trench isolation (DTI) structure that encircles the light collection region to prevent light from entering the light shielded region. Photogate in the light collection region is disposed above a photodiode to accumulate the photo-generated electrical charges. A doped region disposed near the photogate collects the attracted charges. The doped region extends to the light shielded region and transfers the collected charges to a floating diffusion through a shutter transistor also in the light shielded region. DTI or similar structures are deployed to the entire pixel array to prevent light from exchanging between different light collection regions and light from entering the light shielded regions of all pixel cells. Interference between the shielded regions of different pixel cells is also minimized.

28 Claims, 6 Drawing Sheets

(56) References Cited

U.S. PATENT DOCUMENTS

2017/0170229 A1* 6/2017 Oh .................... H01L 27/14621

* cited by examiner

ENHANCED SHUTTER EFFICIENCY TIME-OF-FLIGHT PIXEL

TECHNICAL FIELD

This disclosure relates generally to semiconductor devices, and in particular but not exclusively, relates to time of flight (TOF) image sensors.

BACKGROUND INFORMATION

Interest in three dimensional (3D) cameras is increasing as the popularity of 3D applications continues to grow in areas such as imaging, movies, games, computers, user interfaces, facial recognition, object recognition, augmented reality, and the like. A typical passive way to create 3D images is to use multiple cameras to capture stereo or multiple images. Using the stereo images, objects in the images can be triangulated to create the 3D image. One disadvantage with this triangulation technique is that it is difficult to create 3D images using small devices because there must be a minimum separation distance between each camera in order to create the 3D images. In addition, this technique is complex and therefore requires significant computer processing power in order to create the 3D images in real time.

For applications that require the acquisition of 3D images in real time, active depth imaging systems based on time of flight measurements are sometimes utilized. Time of flight cameras typically employ a light source that directs light at an object, a sensor that detects the light that is reflected from the object, and a processing unit that calculates the distance to the object based on the round-trip time it takes for the light to travel to and from the object.

A continuing challenge with the acquisition of 3D images is balancing the desired performance parameters of the time of flight camera with the physical size and power constraints of the system. These challenges are further complicated by both extrinsic parameters (e.g., desired frame rate of the camera, depth resolution, and lateral resolution) as well as intrinsic parameters (e.g., quantum efficiency of the sensor, fill factor, jitter, and noise).

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
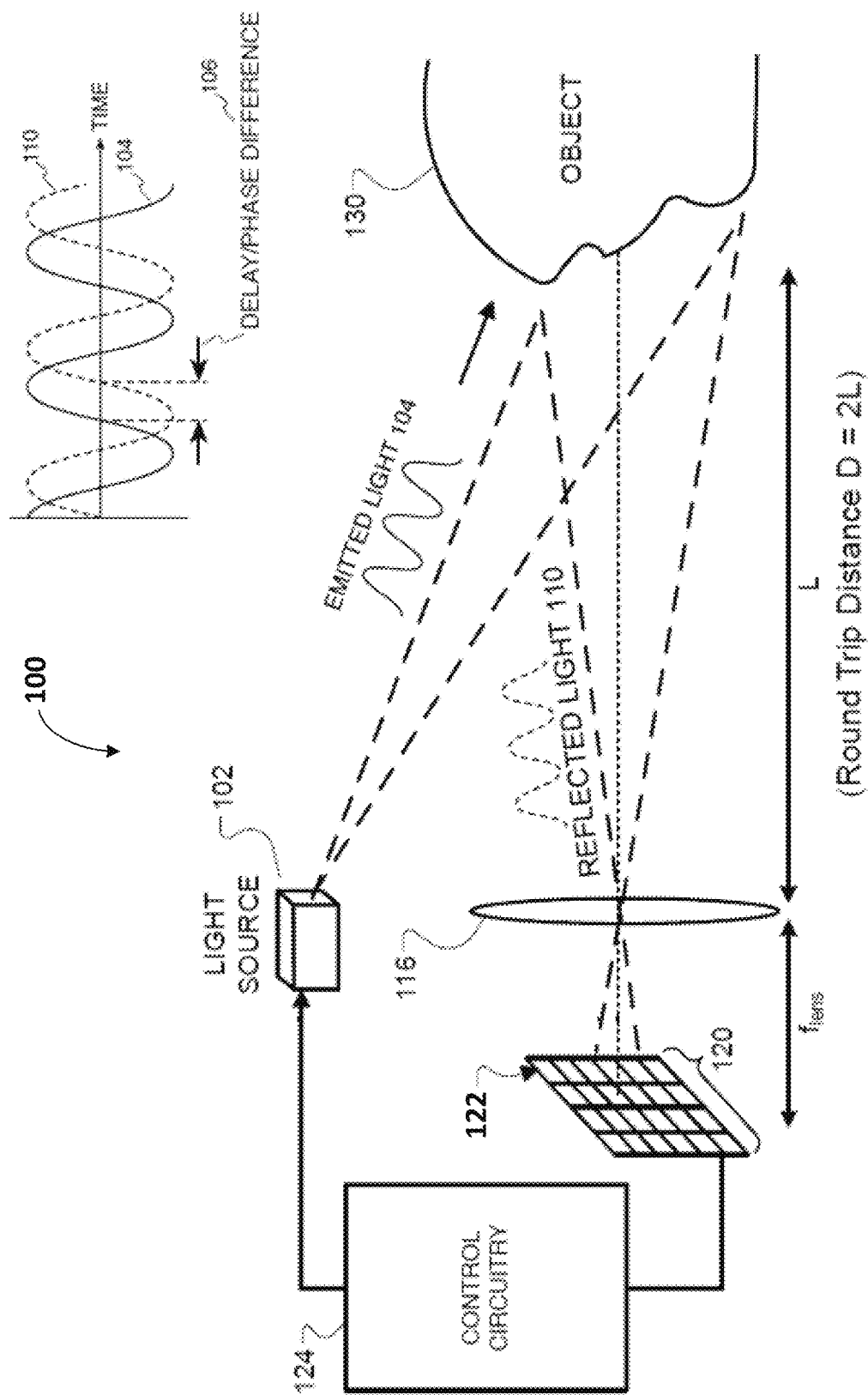
FIG. 1 is a block diagram that shows one example of a time of flight light sensing system including example deep trench isolation (DTI) light blocking structures with central collection photodiodes in time of flight pixels in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Embodiments of an apparatus and method for a fast transfer pixel in an imaging sensor are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise.

As will be discussed, in the various embodiments of this disclosure, a time of flight light sensing system or image sensor having reduced power consumption and improved charge transfer speeds for each individual pixel without increased pixel sizes compared to known photogate indirect time of flight (iTOF) pixel structures are disclosed. For example, one known type of photogate iTOF pixel structure uses large long finger photogates, and toggles between activating the photogates to perform potential modulation to generate a potential gradient to fully deplete the lightly doped silicon substrate/epitaxial layer during integration. Generally, for higher accuracy the known iTOF pixel structure is operated at a high modulated frequency (e.g., 30 MHz-100 MHz-300 MHz or higher). This type of large long photogate generates high capacitance during operation, thereby suffers from a high power consumption requirement (e.g., ~1.2 W), especially at high frequency.

Another known photogate iTOF pixel structure uses high alternating current toggling through two photogates that are located a large distance from each other. Since the high alternating current is required to flow through a silicon substrate of high resistivity, which consequently causes a large IR drop, this iTOF pixel structure also suffers from high power consumption. Furthermore, the power consumed increases significantly at higher operating frequencies. Moreover, the image charge transfer paths in these types of known iTOF pixel structures also are long, which increase the response time of the iTOF pixel structure.

In addition, photogates of known iTOF pixel structures require large pixel areas, thus having a negative impact on fill factor and pixel miniaturization. Furthermore, photogates of known iTOF pixel structures occupy certain space per unit pixel, which reduces the size of photodiodes and limits the full well capacity (FWC) of photodiode the pixel.

FIG. 1 is a block diagram that shows one example of a time of flight light sensing system 100, in accordance with the teachings of the present disclosure. Time of flight light sensing system 100 includes light source 102, lens 116, image sensor in form of two-dimensional pixel array 120 that includes a plurality of pixels such as first pixel 122, and control circuitry 124. As will be discussed in greater detail below, the plurality of pixels included in image sensor pixel array 120 include example deep trench isolation (DTI) encircled photodiode-photogate block structures with central collection photodiodes in time of flight pixels to perform indirect time of flight (iTOF) measurements in accordance with the teachings of the present invention. Control circuitry 124 is coupled to light source 102 and pixel array 120. Pixel array 120 is positioned at a focal length $f_{lens}$ from lens 116.

As shown in the example, light source 102 and lens 116 are positioned at a distance L from object 130. It is appreciated that FIG. 1 is not illustrated to scale and that in one example the focal length $f_{lens}$ is substantially less than the distance L between lens 116 and object 130. Therefore, it is appreciated that for the purposes of this disclosure, the distance L and the distance L+ focal length $f_{lens}$ are substantially equal for the purposes of time of flight measurements in accordance with the teachings of the present invention. As illustrated, pixel array 120 and control circuitry 124 are represented as separate components. However, in one example, it is appreciated that pixel array 120 and control circuitry 124 may all be integrated onto a same stacked chip sensor. In other examples, pixel array 120 and control circuitry 124 may be integrated onto a non-stacked standard planar sensor. Furthermore, it is appreciated that control circuitry 124 may include one or more of amplifiers, high speed A/D converters, comparators, and other mixed signal circuitry. In some examples, each pixel may include one or more avalanche photodiodes (e.g., single-photon avalanche diode) that may be associated with a corresponding one of one or more time-to-digital converters. It is also appreciated, that in some examples, individual time-to-digital converters may be associated with any pre-determined number of pixels.

In the depicted example, time of flight light sensing system 100 is a 3D camera that calculates image depth information of a scene to be imaged (e.g., object 130) based on indirect time of flight (iTOF) measurements with pixel array 120. In some examples, it is appreciated that although time of flight light sensing system 100 is capable of sensing 3D images, time of flight light sensing system 100 may also be utilized to capture 2D images. In various examples, time of flight light sensing system 100 may also be utilized to capture high dynamic range (HDR) images.

Continuing with the depicted example, each pixel of the plurality of pixels in the image sensor 120 determines depth information for a corresponding portion of object 130 such that a 3D image of object 130 can be generated. In the depicted example depth information is determined by measuring the delay or phase difference 106 between emitted light 104 and the received reflected light 110 to indirectly determine a round-trip time for light to propagate from light source 102 to object 130 and back to time of flight light sensing system 100. The depth information may be based on an electric signal generated by the pixel array 120 of the image sensor (e.g., the first pixel 122) that is subsequently transferred to a storage node.

As illustrated, light source 102 (e.g., a light emitting diode, a vertical-cavity surface-emitting laser, or the like) is configured to emit light 104 (e.g., emitted light waves) to the object 130 over a distance L. The emitted light 104 is then reflected from the object 130 as reflected light 110 (e.g., reflected light waves), some of which propagates towards the time of flight light sensing system 100 over the distance L and is incident upon the pixel array 120 of the image sensor as image light. Each pixel (e.g., the first pixel 122) of the plurality of pixels included in the pixel array 120 includes a photodetector (e.g., one or more Complementary Metal-Oxide-Semiconductor photodiodes) to detect the image light and convert the image light into an electric signal (e.g., signal electrons, image charge, etc.).

As shown in the depicted example, the round-trip time for the light waves of the emitted light 104 to propagate from light source 102 to object 130 and then be reflected back to pixel array 120 of the image sensor can be used to determine the distance L using the following relationships in Equations (1) and (2) below:

$$T_{TOF} = \frac{2L}{c} \quad (1)$$

$$L = \frac{T_{TOF} \times c}{2} \quad (2)$$

where c is the speed of light, which is approximately equal to $3 \times 10^8$ m/s, and $T_{TOF}$ corresponds to the round-trip time which is the amount of time that it takes for the light to travel to and from the object as shown in FIG. 1. Accordingly, once the round-trip time is known, the distance L may be calculated and subsequently used to determine depth information of object 130.

Control circuitry 124 is coupled to the pixel array 120 (including first pixel 122) and light source 102, and includes logic that when executed causes time of flight light sensing system 100 to perform operations for determining the round-trip time. Determining the round-trip time may be based on, at least in part, timing signals generated by circuitry 124. For indirect time of flight (iTOF) measurements, the timing signals are representative of the delay or phase difference 106 between the light waves of when the light source 102 emits light 104 and when the photodetector detects the reflected image light 110.

In some examples, time of flight light sensing system 100 is included in a handheld device (e.g., a mobile phone, a tablet, or a camera, etc.) that has size and power constraints determined, at least in part, based on the size of the device. Alternatively, or in addition, time of flight light sensing system 100 may have specific desired device parameters such as frame rate, depth resolution, lateral resolution, etc.

Figure 2:
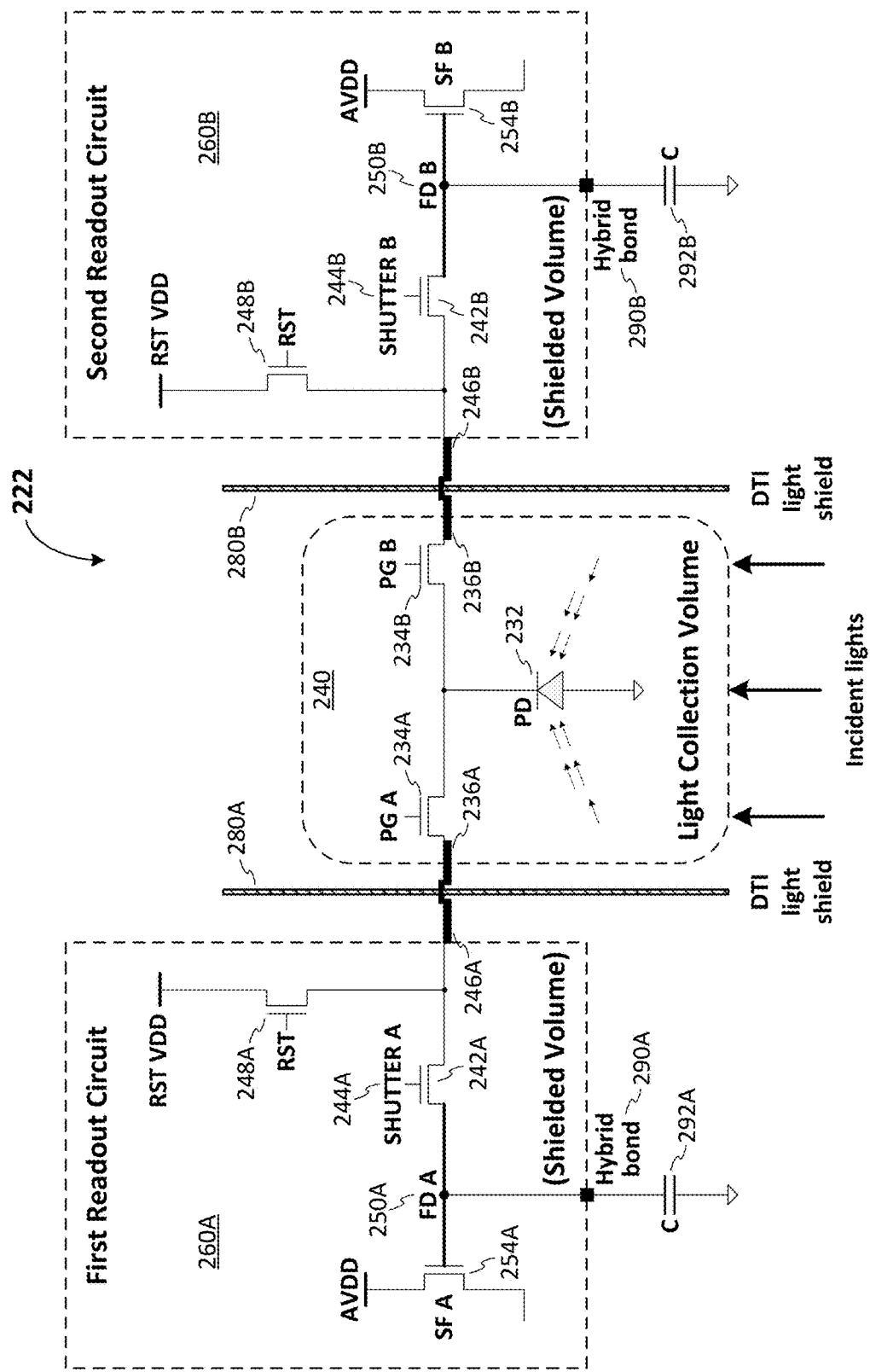
FIG. 2 is a schematic that shows one example of a TOF pixel circuit including example deep trench isolation (DTI) light shield that physically separates light collection volume structure from the readout circuit structures in accordance with the teaching of the present disclosure.

FIG. 2 is a schematic that shows one example of a TOF pixel circuit 222 including example deep trench isolation (DTI) light shield that physically separates light collection volume structure from readout circuit structure (in a shielded volume) in accordance with the teaching of the present disclosure. The DTI may be filled with dielectrics or metal. The DTI may also be filled with any materials designed to block light. It is appreciated that pixel circuit 222 of FIG. 2 may be an example of a pixel cell 122 of the pixel array 120 of the image sensor as shown in FIG. 1, and that similarly named and numbered elements described above are coupled and function similarly below.

As shown in FIG. 2, pixel circuit 222 includes a photodiode 232, which is configured to accumulate image charge in response to light that is incident upon the photodiode 232. As will discussed in greater detail below, in one example, the photodiode 232 is a central collecting photodiode disposed in semiconductor material layer with a doping profile that creates a potential profile that pushes photogenerated image charge carriers to the surface of the semiconductor material layer towards the center of the photodiode 232. In the illustrated example, a photogate A 234A and a photogate B 234B are coupled to the photodiode 232 to collect the photogenerated image charge carriers from the photodiode 232 with low power consumption at improved charge transfer speeds in accordance with the teachings of the present invention. As shown in the depicted example, the photogate A 234A is also coupled to a floating diffusion (FD) A 250A. Similarly, the photogate B 234B is also coupled to a floating diffusion (FD) B 250B. A demodulating TOF pixel as disclosed requires the ability to direct charges to the FD A 250A or FD B 250B to determine the phase.

FIG. 2 shows a shutter transistor A 242A having a source terminal coupled to the photodiode 232 through the photogate A 234A and a drain terminal coupled to the FD A 250A, and a reset transistor A 248A having a source terminal coupled to the photodiode 232 through the photogate A 234A and a drain terminal coupled to a reset power supply RST VDD.

In operation, the photogate A 234A is configured to accumulate the image charges generated by the photodiode 232 in response to a high voltage. A first doped region A 236A and second doped region A 246A, where the first doped region A 236A and second doped region A 246A are electrically connected, collect the accumulated charges and pass those image charges to a source terminal of a shutter transistor A 242A. The shutter transistor A 242A is configured to transfer the image charges in the first and second doped regions 236A/246A to the floating diffusion (FD) A 250A in response to a shutter signal SHUTTER A asserted to a gate terminal 244A of the shutter transistor A 242A. A source follower (SF) transistor A 254A amplifiers charges transferred to the FD A 250A to voltage signal at a source terminal of the SF transistor A 254A as image signal output A.

Similarly, a photogate B 234B is coupled between a first doped region B 236B and the photodiode 232. The first doped region B 236B is electrically connected to the second doped region B 246B. A shutter transistor B 240B is coupled between the first and second doped regions 236B/246B to transfer the image charges to the FD B 250B in response to a shutter signal SHUTTER B asserted to a gate terminal 244B of a shutter transistor B 242B. A reset transistor B 248B is coupled between the reset power supply and the second doped region 246B. A SF transistor B 254B amplifiers charges transferred to the FD B 250B to voltage signal at a source terminal of the SF transistor B 254B as image signal output B.

As shown in FIG. 2, a deep trench isolation (DTI) shield A 280A is disposed between a light collection volume 240 and a first readout circuit 260A to shield its photosensitive semiconductor components from being disturbed by any incident lights. Likewise, a DTI shield B 280B is disposed between the light sensing volume 240 and a second readout circuit 260B to shield its photosensitive semiconductor components from being disturbed by any incident lights. The first readout circuit 260A and the second readout circuit 260B may be viewed as being isolated by the DTI to shielded volumes from the light sensing volume. The DTI hereby significantly improves shutter rejection so that background light does not add noise to demodulated signals during the readout phase. Achieving good shutter rejection also helps improve demodulation contrast by avoiding signal intended for one phase being parasitically collected in another phase.

The light collection volume 240 comprises the photodiode 232, the photogate A 234A, and the photogate B 234B. The first readout circuit 260A comprises the shutter transistor 242A, the reset transistor 248A, the FD 250A, and the SF 254A. The second readout circuit 260B comprises the shutter transistor 242B, the reset transistor 248B, the FD 250B, and the SF 254B.

Based on the pixel circuit 222 disclosed in FIG. 2, an example of operations for the pixel operating in a 3D depth mode begin with a precharge reset period, during which time the elements in the pixel are precharged or reset to initial values. As such, during the initial precharge or reset period, the photogates 234A and 234B, the shutter transistors 242A and 242B, and the reset transistors 248A and 248B are switched on by sending a single pulse to each of their gates.

During the integration period, the photogate A and photogate B are alternatingly pulsed, which alternatingly transfers or pumps the photogenerated charges from the photodiode 232 to either the first/second doped regions 236A/246A or the first/second doped regions 236B/246B in repeated individual succession during the integration period of the pixel. In addition, the shutter signals 244A and 244B may be enabled alternatingly during the integration period, which enables the charge transferred from the photodiode to be stored alternatingly in either FD A 250A or FD B 250B during the integration period.

In one embodiment, the FD A 250A and the FD B 250B by themselves only offer limited storage capacities. As such, the pixel cell is set for low FWC and high conversion gain in the given example in accordance with the teachings of the present invention. In another embodiment, the FD A 250A and the FD B 250B may be joined, either directly or through switches, by a capacitor $C_{FDA}$ 292A and a capacitor $C_{FDB}$ 292B, respectively, to expand the overall combined storage capacities which appear at floating diffusions 250A and 250B for each detecting phase of the TOF. The capacitors $C_{FDA}$ 292A and $C_{FDB}$ 292B may be integrated on the same silicon die or integrated on a different silicon die with even larger possible values and coupled to floating diffusions 250A and 250B through hybrid bonds 290A and 290B, respectively, in a stacked die configuration. As such, the pixel is set for high FWC and low conversion gain in the depicted example in accordance with the teachings of the present invention.

Figure 3:
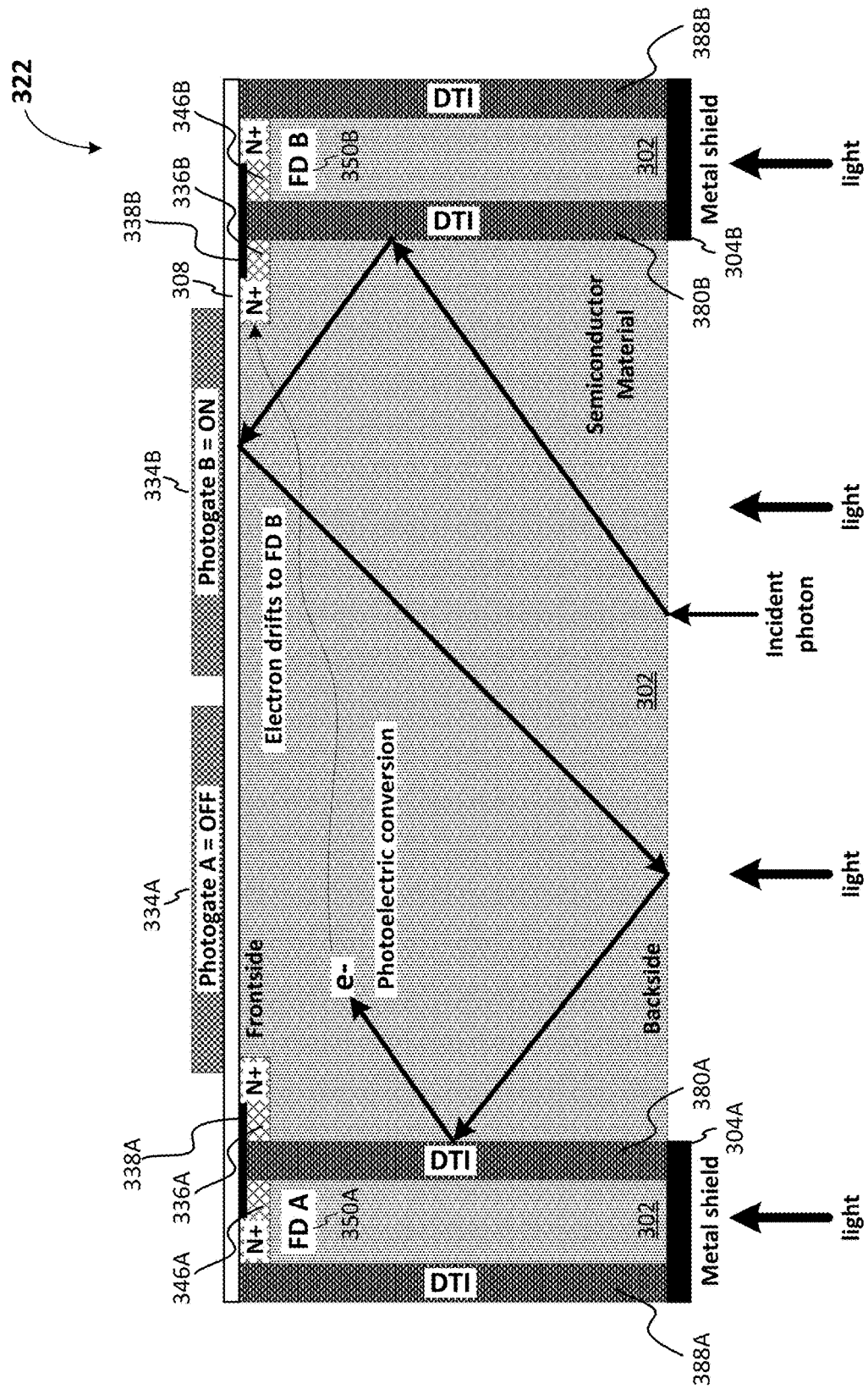
FIG. 3 is an illustrative cross-section view example of a TOF pixel cell of FIG. 2 included in the plurality of pixel array in the TOF system of FIG. 1 in accordance with an embodiment of the present disclosure.

FIG. 3 illustrates a cross-section view example of a TOF pixel cell 222 included in the plurality of pixel array 120 in the TOF system 100 of FIG. 1. The time-of-flight (TOF)

pixel 322 comprises a semiconductor material 302 (e.g., p⁻⁻ substrate, epitaxial silicon, or the like), and photogates 334A and 334B (e.g., polysilicon or doped polysilicon) which are disposed proximate to a frontside (or front surface) of the semiconductor material 302 and positioned to transfer charges in semiconductor material 302 toward the frontside of the semiconductor material 302 in response to a voltage applied to either the photogate 334A or 334B. Floating diffusions 350A and 350B (e.g., strongly doped n-type) are disposed in the semiconductor material 302 proximate to (e.g., implanted in) the frontside of the semiconductor material 302. The first and second doped regions are typically strongly doped n-type (a conductive type, e.g., N+ polycrystalline or epitaxial silicon) regions. Therefore the N+ regions: a first N+ region A 336A, a second N+ region A 346A, a first N+ region B 336B, and a second N+ region B 346B are implanted in the semiconductor material 302 proximate to the frontside of the semiconductor material 302.

Each of the first N+ regions 336A or 336B is disposed within the semiconductor material 302, adjacent to one end of each photogates 334A or 334B, and partially under each photogates 334A or 334B, respectively, as shown in FIG. 3. And each of the first N+ regions 336A or 336B is located laterally away from the central photodiode area by locating each of the first N+ regions 336A or 336B toward where each of the FDs 350A or 350B is, respectively, to transfer the image charge corresponding to image and phase-shift information to each of the FDs 350A or 350B to demodulating TOF pixels.

TOF pixels require high speed transfer to achieve high demodulation contrast for accurate depth resolution. The FDs 350A and 350B may also be doped regions with a fairly high dopant concentration and a fairly deep implant into semiconductor material 302 in comparing to the depth of the first and second doped N+ regions 336A/336B and 346A/346B.

In the depicted example, the first N+ regions 336A and 336B are implanted to the frontside of the semiconductor material 302 to achieve a lateral potential to accelerate electron transfer by electric field underneath the photogates 334B and 334A. One of skill in the art having the benefit of the present disclosure will appreciate that the first N+ regions 336A and 336B may be implanted with dopant such as arsenic, phosphorus, or other semiconductor dopants through the use of implant mask, and with different implant energy. Further, it is worth noting that the doped implant doses (defining doping concentrations) may be low enough that they can be fully depleted by the application of gate and drain bias. It is also worth noting that only the lightly doped silicon substrate/epitaxial layer inside the central semiconductor material 302 may be close to full depletion. The first N+ regions 336A and 336B may not be fully depleted since the doping concentration is too high.

In the demonstrated example of FIG. 3, a photon converted electron e– generated in the photodiode region of the central semiconductor material 302 can be accelerated toward the first N+ region 336B and being absorbed by the first N+ region 336B when the photogate B 334B is turned on and the photogate A 334A is turned off, although the photon converted electron e– may appear in the vicinity of photogate A 334A and the first N+ region 336A associated with the photogate 334A. This may demonstrate how effective the photogate-N+-region mechanism is in accelerating the photon converted electrons to be accumulated and collected.

In the example TOF pixel cell 322, light enters the photodiode 232 implanted in the semiconductor material 302 through the backside. This type of technology in photodiode is called back-side illumination (BSI) photodiode. TOF pixels typically operate at near infrared (NIR) wavelengths and require high quantum efficiency (QE) to achieve long range operation and fast frame rates demanded by applications. The high NIR QE is required for TOF pixels to reduce the power consumption and to increase the range of detection of the system. For weak light, NIR of 850 nm or 940 nm may be used for the emitting and receiving of light. The use of NIR light is also an eye safety measure. In general, higher frequency enables more precise distance measurement, and the use of multiple wavelengths reduces the range ambiguity. To increase the quantum efficiency (QE) of a photodiode for the purpose of weak light detection, for the type of photodiode disclosed herein, photons of NIR light are allowed to scatter multiple times and/or internally reflected multiple times to increase absorption—the chances of photons being converted into electrons. Once electrons have been generated efficiently, those electrons need to be transferred from the light collection volume 240 to the FDs 350A and 350B, in efficient and fast fashions.

Achieving high shutter efficiency is the role of the shutter transistor 242A and 242B. TOF pixels normally require good shutter rejection so that background light does not add noise to demodulated signal during the readout period. Achieving good shutter rejection also helps improve demodulation contrast by avoiding signal intended for one phase (at, say, the FD A) being parasitically collected in the other phase (at, say, the FD B).

As mentioned earlier, in the example type of structure, photons of NIR light enter from the backside of the semiconductor material 302 are allowed to scatter and reflected multiple times within the light collection volume 240 to increase absorption and therefore the QE. For the standard BSI technology, metal shields 304A and 304B are needed to block the light from being detected by the wrong FD A 350A or FD B 350B. That is important because each of FD A and FD B may be alternatively enabled in example of use, timing wise, to associate with directly designated phase of information, instead of partially mixed phases of information to lower the demodulation contrast. In additional to the metal shields which have already been applied to block direct light (perpendicular incident light) from reaching the wrong FD, to further optically isolate other photosensitive semiconductor elements found in the first and second readout circuits 260A and 260B from highly scattered radiation, deep trench isolations (DTI) 380A and 380B are also integrated in the semiconductor material 302 to encircle the light collection volume 240 to optically block the light, in either direct or scattered ways, from reaching any photosensitive semiconductor elements in the first and second readout circuits 260A and 260B—the shielded volumes.

When the material of DTI is made mostly of silicon dioxide instead of metal(s), the scattered light may not be fully blocked by 100%. This is because the total internal reflection is not always guaranteed—a small amount of scattered photons that enter the surface of DTI with angles smaller than what suggested by Fresnel principle will penetrate the DTI. However, the present of the newly added DTI will greatly reduce the lights of the light collection volume 240 from reaching and interfering with the performance of the first and second readout circuits 260A and 260B in the shielded volumes. Dynamically, the light collection volume 240 comprises the incident light (in either direct or scattered ways), the photodiode 232, the photogates A 334A and B 334B, and the first N+ regions 336A and 336B.

Dual DTI layers 380A/388A and 388B/388B offer full isolations to isolate the shielded volumes from the light collection volume, where highly scattered radiations are presented, and also from lights coming from other surrounding pixel cells. DTI layers 388A and 388B may already exist before the introduction of the DTI layers 380A and 380B, to optically shield TOF pixel cells 122 from each other in the pixel array 120 to begin with. Where in the new structure we are going to introduce later in FIG. 6, it may demonstrate, when the layout of the pixel cell is appropriately arranged as disclosed in present feature, the use of DTI layers 388A and 388B may prove to be unnecessary, in the present disclosure.

A gate oxide layer 308 (e.g., silicon oxide, hafnium oxide, or the like), an insulating layer, may be disposed between the semiconductor material 302 and the photogates 334A/334B, between the semiconductor material 302 and the shutter gates 444A/444B, between the semiconductor material 302 and the gates 448A/448B of the reset transistors 248A/248B, between the semiconductor material 302 and the gates 454A/454B of the SF transistors 254A/254B, and between the semiconductor material 302 and the gates of other transistors that the first and second readout circuits may comprise in other embodiments. Where the photogates 334A/334B, the shutter gates 444A/444B, the gates 448A/448B of the reset transistors 248A/248B, the gates 454A/454B of the SF transistors 254A/254B, and the gates of other transistors in the pixel cell are polysilicon, doped polysilicon, or metal.

As an example, a jumping metal stripe 338A is disposed across the DTI 380A to electrically connect the first N+ region 336A to the second N+ region 346A. The jumping metal stripe 338A may be disposed between the gate oxide layer 308 and the DTI 380A, as shown in FIG. 3. As an example, a jumping metal stripe 338B is disposed across the DTI 380B to electrically connect the first N+ region 336B to the second N+ region 346B. The jumping metal stripe 338B may be disposed between the gate oxide layer 308 and the DTI 380B.

Figure 4:
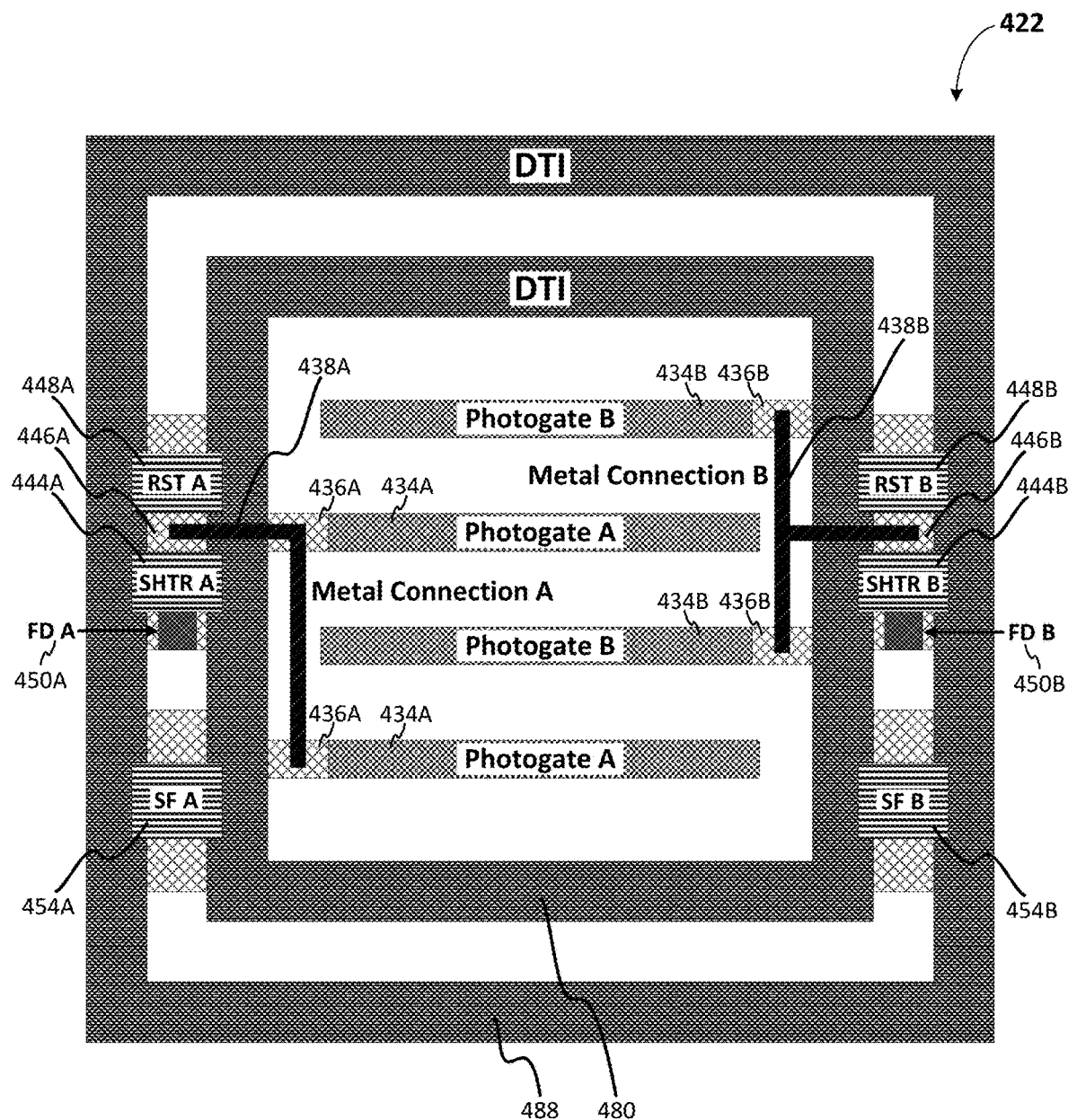
FIG. 4 is an illustrative top view example of the schematic of FIG. 2 where an inner DTI ring encircles an entire light collection volume which comprises the photodiode, photogates with multiple "fingers", and the doped regions in accordance with an embodiment of the present disclosure.

Physically, as depicted in the top view example shown in FIG. 4, the entire light collection volume 240 which comprises the photodiode 232, the photogates 434A and 434B, and the first N+ regions 436A and 436B, is encircled by an inner DTI ring 480. The possible reduction of light sensitive area due to the integration of DTI is unwanted drawback, but may be compensated with the use of microlenses. The photogate A 434A may comprise one or multiple photogate "fingers" as depicted in FIG. 4. The size and number of the photogate "fingers" are the trade-offs of capacitance, power consumption and electric field. For each photogate A 434A, there is a first N+ region 436A (this region may also be viewed as a drain terminal of a photogate transistor as shown in FIG. 2) to pair with. For multiple photogate A "fingers", each of their pairing first N+ regions 436A are interconnected by metal stripe or stripes. A jumping metal stripe 438A is disposed across the inner DTI ring 480 to electrically connect one of the first N+ regions 436A to the second N+ region 446A.

Similarly, the photogate B 434B may comprise one or multiple photogate "fingers" as depicted in FIG. 4, to interleave with the photogate A "fingers" 434A. For each photogate B 434B, there is a first N+ region 436B (a drain terminal of a photogate transistor) to pair with. For multiple photogate B "fingers", each of their pairing first N+ regions 436B are interconnected by metal stripe or stripes. A jumping metal stripe 438B is disposed across the inner DTI ring 480 to electrically connect one of the first N+ region 436B to the second doped region 446B.

In FIG. 4, the entire first readout circuit 260A, as a shielded volume, is disposed between the inner DTI ring 480 and the outer DTI ring 488. That is, enclosed by the DTIs. A shutter gate 244A/444A of the shutter transistor A 242A is disposed proximate to the frontside of the semiconductor material 302, and laterally between the second N+ region 446A and the floating diffusion (FD) 450A. The shutter gate 444A may either facilitate charge transfer from the second N+ region 446A to the FD 450A, or inhibit charge transfer to the FD 450A depending on the voltage (e.g., positive or negative) and the polarity of the transistor (PMOS or NMOS) applied to the shutter gate 444A. In some examples, a voltage may be applied to the photogate 434A and the shutter gate 444A at the same time, and the voltage applied to the shutter gate 444A may be greater than, but of the same polarity as the voltage applied to the photogate 434A to further enhance speed of charge transfer to the FD 450A.

Similar in FIG. 4, the entire second readout circuit 260B is disposed between the inner DTI ring 480 and the outer DTI ring 488. A shutter gate 244B/444B of the shutter transistor A 242B is disposed proximate to the frontside of the semiconductor material 302, and laterally between the doped region 446B and the floating diffusion (FD) 450B. The shutter gate 444B may either facilitate charge transfer from the second N+ region 446B to the FD 450B, or inhibit charge transfer to the FD 450B depending on the voltage (e.g., positive or negative) applied to the shutter gate 444B. In some examples, a voltage may be applied to the photogate 434B and the shutter gate 444B at the same time, and the voltage applied to the shutter gate 444B may be greater than, but of the same polarity as the voltage applied to the photogate 434B to further enhance speed of charge transfer to the FD 450B.

Figure 5:
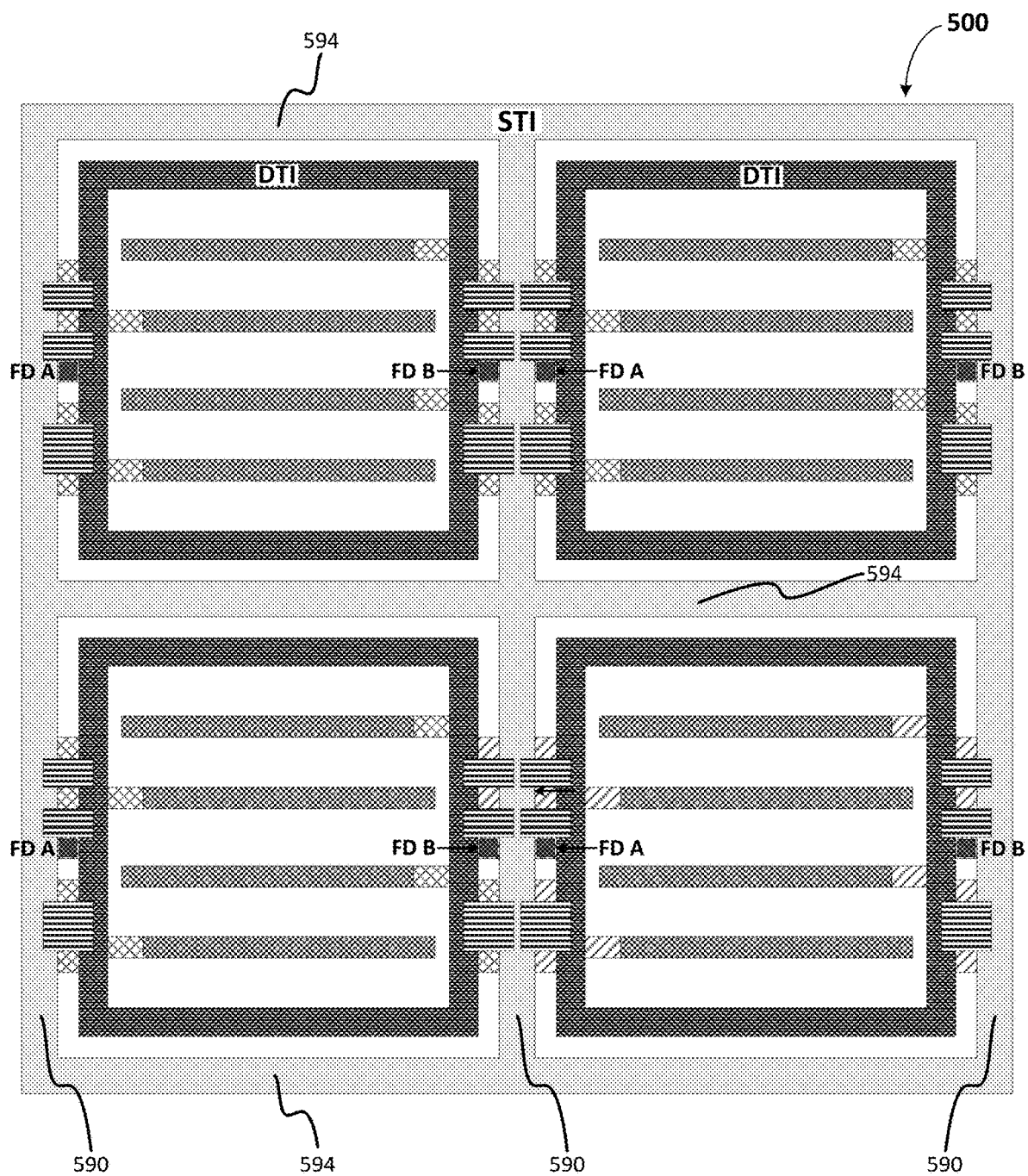
FIG. 5 is a top view example of using shallow trench isolation (STI) in isolating pixel cells in accordance with an embodiment of the present disclosure.

FIG. 5 is a top view example 500 of using shallow trench isolation (STI) in isolating pixel cells. The STI isolation layer replaces the DTI layers 488 shown in FIG. 4 for better fill factor between pixel cells. In one embodiment demonstrated by pixel array isolation 500, each pixel cell comprises a light collection volume 240 encircled by the DTI 480, a first readout circuit 260A as a shielded volume, disposed laterally alongside a first vertical wall of the two vertical outer walls of the encirclement of the DTI structure 480, a second readout circuit 260B as another shielded volume disposed laterally alongside a second vertical wall of the two vertical outer walls of the encirclement of the DTI structure 480. To prevent interference or cross talk between the first readout circuit 260A of one pixel cell and the second readout circuit 260B of its adjacent pixel in the same row of the pixel array, pixel cells are separated in horizontal direction by vertically arranged STI columns 590 to be electrically isolated. Pixel cells are also separated in vertical direction by horizontally arranged STI rows 594 for additional isolations.

In FIG. 5, if fill factor is not a concern, for simplicity of using DTI only as isolations, STI columns 590 integrated into pixel array can be replaced by DTI columns to electrically isolate pixel cells from each other vertically. STI rows 594 integrated into pixel array can also be replaced by DTI rows to electrically isolate pixel cells from each other horizontally.

Figure 6:
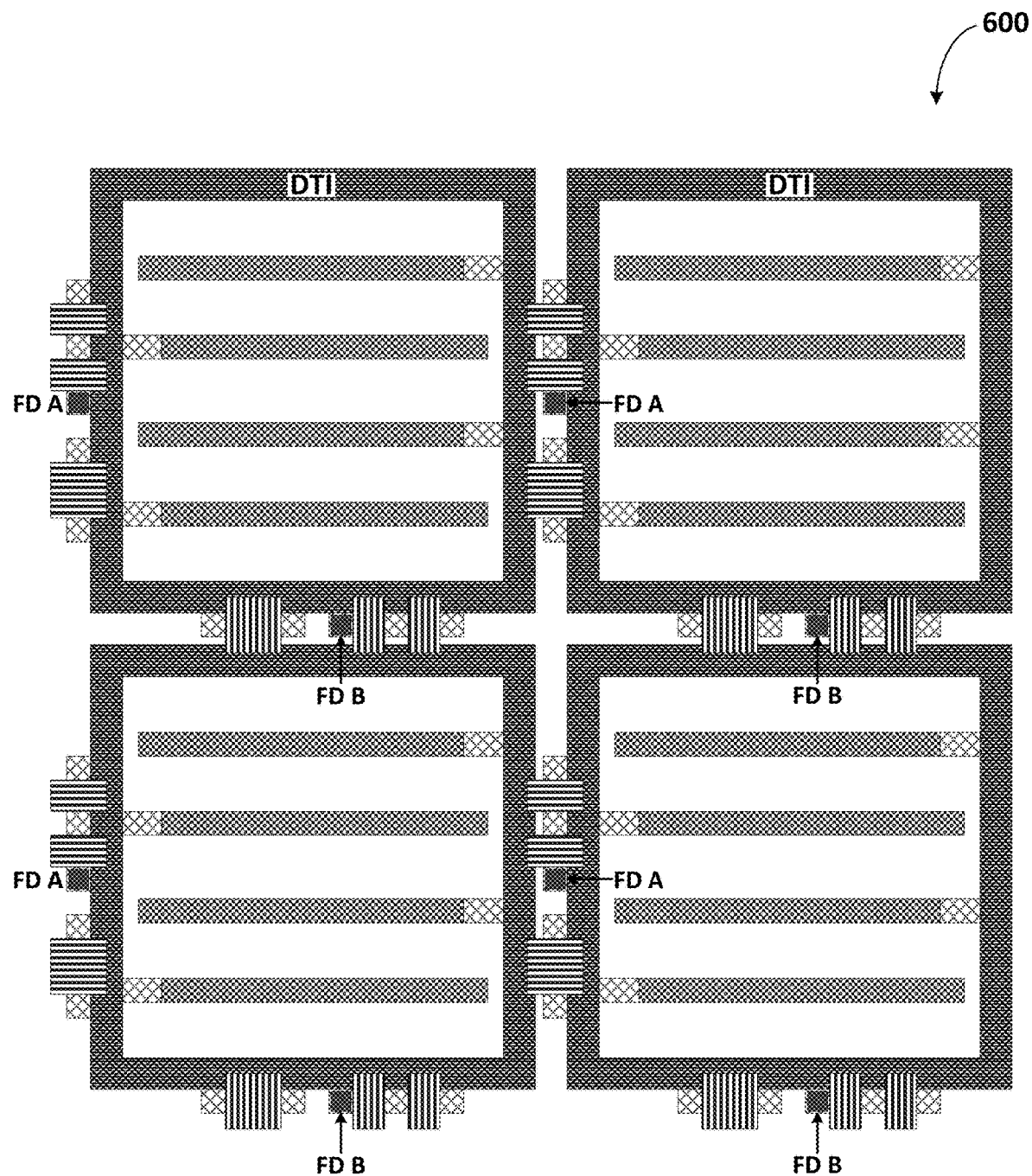
FIG. 6 is another top view example of isolating pixel cells by placing readout circuits along perpendicular sides of the DTI ring without the need of dividing pixel cells using STI or DTI grid to the pixel array in accordance with an embodiment of the present disclosure.

FIG. 6 is another top view example of readout transistors sharing the silicon areas between the DTI rings without the need of using the STI layer as disclosed in FIG. 5. In another embodiment demonstrated by pixel array isolation 600, each pixel cell comprises a light collection volume 240 encircled by the DTI 480, a first readout circuit 260A disposed laterally alongside one of the two vertical outer walls encircling the DTI structure 480, a second readout circuit 260B disposed laterally alongside one of the two horizontal outer walls encircling the DTI structure 480. Electrical interferences or cross talks between the first readout circuit 260A and the second readout circuit 260B of any pixel cells are automatically avoided or reduced since no first readout circuits and second readout circuits are closely placed in parallel to each other as seen in FIG. 5 to involve any DTI/STI rows 594 or columns 590 in electrically isolations. This configuration improves the fill factor of the pixel cell 222 while maintaining the advantages of optical isolation between the light collection volume 240 and the shielded volumes 260A and 260B for better shutter efficiency. It is important to note that all discrete silicon volumes created by separating regions with DTI require their own ground or substrate connections. These are not included in FIGS. 5 and 6 for clarity.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A time-of-flight (TOF) pixel array, comprising:
   a pixel cell, wherein the pixel cell comprises a first cell region, a second cell region, and a deep trench isolation (DTI) structure,
   wherein the first cell, region comprises
      a photodiode disposed in a semiconductor material layer to accumulate image charges in response to light incident upon the photodiode,
      a first photogate disposed proximate to a frontside of the semiconductor material layer and positioned above the photodiode to attract charges in the semiconductor material layer toward the frontside in response to a Voltage applied to the first photogate, and
      a first doped region disposed proximate to the frontside of the semiconductor material layer, wherein the first doped region is implanted partially underneath the first photogate to accumulate charges of the photodiode when the voltage is applied to the first photogate,
   wherein the second cell region comprises
      a second doped region disposed proximate to the frontside of the semiconductor material layer,
      a floating diffusion (FD) disposed in the semiconductor material layer proximate to the frontside of the semiconductor material layer,
      a shutter transistor disposed proximate to the frontside of the semiconductor material layer, wherein a source terminal of the shutter transistor is coupled to the second doped region, wherein a drain terminal of the shutter transistor is coupled to the FD, and wherein a gate terminal of the shutter transistor is configured to transfer the image charges in the second doped region to the FD in response to a shutter signal, and
   wherein the DTI structure is disposed in the semiconductor material layer to laterally encircle the first cell region.

2. The TOF pixel array of claim 1, further comprising a metal jumper coupled between the first doped region and the second doped region.

3. The TOF pixel array of claim 1, further comprising an oxide layer disposed between the semiconductor material layer and the first photogate, and between the semiconductor material layer and the gate terminal of the shutter transistor.

4. The TOF pixel array of claim 1, wherein the second cell region further comprises a reset transistor disposed proximate to the frontside of the semiconductor material layer, wherein a source terminal of the reset transistor is coupled to the second doped region, and wherein an oxide layer is disposed between the semiconductor material layer and the gate terminal of the reset transistor.

5. The TOF pixel array of claim 1, wherein the second cell region further comprises a source follower (SF) transistor disposed proximate to the frontside of the semiconductor material layer, and wherein a gate terminal of the SF transistor is coupled to the FD, and wherein an oxide layer is disposed between the semiconductor material layer and the gate terminal of the SF transistor.

6. The TOF pixel array of claim 1, wherein the first photogate in the pixel cell is one of polysilicon, doped polysilicon, and metal, and wherein the gate of the shutter transistor in the pixel cell is one of polysilicon, doped polysilicon, and metal.

7. The TOF pixel array of claim 1, wherein the first cell region comprises a plurality of first doped regions, wherein the first photogate comprises a plurality of photogate fingers, and wherein one ends of the photogate fingers are positioned partially above the first doped regions.

8. The TOF pixel array of claim 7, wherein the first doped regions are interconnected to each other by a metal stripe.

9. The TOF pixel array of claim 7, wherein the pixel cell includes the first photogate and a second photogate and a first and second readout circuits, wherein each one of the first and second readout circuits comprises the reset transistor, the shutter transistor, the FD, and the SF transistor.

10. The TOF pixel array of claim 9, wherein the pixel cell comprises the first readout circuit disposed laterally alongside a first wall of the four outer walls encircling the DTI structure and the second readout circuit is disposed laterally, alongside a second wall of the four outer walls encircling the DTI structure, which is perpendicular to the first wall.

11. The TOF pixel array of claim 9, wherein the pixel cell comprises the first readout circuit disposed laterally alongside a first wall of the four outer walls encircling the DTI structure and the second readout circuit is disposed laterally alongside a second wall of the four outer walls encircling the DTI structure, which is parallel to the first wall.

12. The TOF pixel array of claim 1, further comprising a plurality of row pixel-separation DTIs and a plurality of column pixel-separation DTIs, wherein the pixel cell is encircled by the two row pixel-separation DTIs and two column pixel-separation DTIs.

13. The TOF pixel array of claim 1, further comprising a plurality of row shallow trench isolations (STIs) and a plurality of column STIs, wherein the pixel cell is encircled by the two row STIs and two column STIs.

14. The TOF pixel array of claim 1, wherein the first doped region and the second doped region are strongly doped n-type regions that are conductive.

15. A time-of-flight (TOF) light sensing system, comprising:
   a light source to emit light to an object;
   a pixel array optically coupled to sense the emitted light that is reflected from the object,
      wherein the pixel array comprises a pixel cell, wherein the pixel cell comprises a first cell region, a second cell region, and a deep trench isolation (DTI) structure,
      wherein the first cell region comprises
         a photodiode disposed in a semiconductor material layer to accumulate image charges in response to light incident upon the photodiode,
         a first photogate disposed proximate to a frontside of the semiconductor material layer and positioned above the photodiode to attract charges in the semiconductor material layer toward the frontside in response to a voltage applied to the first photogate, and
         a first doped region disposed proximate to the frontside of the semiconductor material layer, wherein the first doped region is implanted partially underneath the first photogate to accumulate charges of the photodiode when the voltage is applied to the first photogate,
      wherein the second cell region comprises
         a second doped region disposed proximate to the frontside of the semiconductor material layer,
         a floating diffusion (FD) disposed in the semiconductor material layer proximate to the frontside of the semiconductor material layer,
         a shutter transistor disposed proximate to the frontside of the semiconductor material layer, wherein a source terminal of the shutter transistor is coupled to the second doped region, wherein a drain terminal of the shutter transistor is coupled to the FD, and wherein a gate terminal of the shutter transistor is configured to transfer the image charges n the second doped region to the FD in response to a shutter signal, and
      wherein the DTI structure is disposed in the semiconductor mat layer to laterally encircle the first cell region; and
   control circuitry coupled to control the light source and the pixel array to sense the emitted light that is reflected from the object to the pixel array.

16. The TOF light, sensing system of claim 15, further comprising a metal jumper coupled between the first doped region acid the second doped region.

17. The TOF light sensing system of claim 15, further comprising an oxide layer disposed between the semiconductor material layer and the photogate, and between the semiconductor material layer and the gate terminal of the shutter transistor.

18. The TOF light sensing systems of claim 15, wherein the second cell region further comprises a reset transistor disposed proximate to the frontside of the semiconductor material layer, wherein a source terminal of the reset transistor is coupled to the second doped region, and wherein an oxide layer is disposed between the semiconductor material layer and the gate terminal of the reset transistor.

19. The TOF light sensing system of claim 15, wherein the second cell region further comprises a source follower (SF) transistor disposed proximate to the frontside of the semiconductor material layer, and wherein a gate terminal of the SF transistor is coupled to the FD, and wherein an oxide layer is disposed between the semiconductor material layer and the gate terminal of the SF transistor.

20. The TOF light sensing system of claim 15, wherein the first photogate is one of polysilicon, doped polysilicon, and metal, and wherein the gate of the shutter transistor in the pixel cell is one of polysilicon, doped polysilicon, and metal.

21. The TOF light sensing system of claim 15, wherein the first cell region comprises a plurality of first doped regions, wherein the first photogate comprises a plurality of photogate fingers, and wherein one ends of the photogate fingers are positioned partially above the first doped regions.

22. The TOF light sensing system of claim 21, wherein the first doped regions are interconnected to each other by a metal stripe.

23. The TOF light sensing system of claim 21, wherein the pixel cell includes the first photogate and a second photogate and a first and second readout circuits, wherein each one of the first and second readout circuits comprises the reset transistor, the shutter transistor, the FD, and the SF transistor.

24. The TOF light sensing system of claim 23, wherein the pixel cell comprises the first readout circuit disposed laterally alongside a first wall of the four outer walls encircling the DTI structure and the second readout circuit is disposed laterally alongside a second wall the four outer walls encircling the DTI structure, which is perpendicular to the first wall.

25. The TOF light sensing system of claim 23, wherein the pixel cell comprises the first readout circuit disposed laterally alongside a first wall of the four outer walls encircling the DTI structure and the second readout circuit is disposed laterally alongside a second wall of the four outer walls encircling the DTI structure, which is parallel to the first wall.

26. The TOF light sensing system of claim 15, further comprising a plurality of row pixel-separation DTIs and a plurality of column pixel-separation DTIs, wherein the pixel cell is encircled by the two row pixel-separation DTIs and two column pixel-separation DTIs.

27. The TOF light sensing system of claim 15, further comprising a plurality of row shallow trench isolations (STIs) and a plurality of column STIs, wherein the pixel cell is encircled by the two row STIs and two column STIs.

28. The TOF light sensing system of claim 15, wherein each one of the first doped region and the second doped region are strongly doped n-type regions that are conductive.

* * * * *